(12) United States Patent
Kroll et al.

(10) Patent No.: US 8,981,200 B2
(45) Date of Patent: Mar. 17, 2015

(54) METHOD FOR OBTAINING HIGH PERFORMANCE THIN FILM DEVICES DEPOSITED ON HIGHLY TEXTURED SUBSTRATES

(75) Inventors: Ulrich Kroll, Corcelles (CH); Evelyne Vallat-Sauvain, Chezard St. Martin (CH); Daniel Borrello, Cortaillod (CH); Johannes Meier, Corcelles (CH)

(73) Assignee: Tel Solar AG, Trubbach (CH)

( * ) Notice: Subject to any disclaimer, the term of this patent is extended or adjusted under 35 U.S.C. 154(b) by 777 days.

(21) Appl. No.: 12/808,200

(22) PCT Filed: Dec. 18, 2008

(86) PCT No.: PCT/EP2008/067936
§ 371 (c)(1),
(2), (4) Date: Aug. 26, 2010

(87) PCT Pub. No.: WO2009/077605
PCT Pub. Date: Jun. 25, 2009

(65) Prior Publication Data
US 2010/0313932 A1   Dec. 16, 2010

Related U.S. Application Data

(60) Provisional application No. 61/014,799, filed on Dec. 19, 2007.

(51) Int. Cl.
  H01L 31/00     (2006.01)
  H01L 31/042    (2014.01)
  H01L 31/0236   (2006.01)
  H01L 31/0224   (2006.01)
  H01L 31/18     (2006.01)

(52) U.S. Cl.
  CPC .... *H01L 31/0236* (2013.01); *H01L 31/022466* (2013.01); *H01L 31/1884* (2013.01); *Y02E 10/50* (2013.01)
  USPC ............................ 136/243; 136/244; 136/251

(58) Field of Classification Search
  USPC .................................................. 136/244, 256
  See application file for complete search history.

(56) References Cited

U.S. PATENT DOCUMENTS

| | | | | |
|---|---|---|---|---|
| 4,633,034 A | * | 12/1986 | Nath et al. | 136/256 |
| 4,900,370 A | | 2/1990 | Itoga et al. | |
| 5,500,055 A | * | 3/1996 | Toyama et al. | 136/259 |
| 5,589,403 A | * | 12/1996 | Toyama et al. | 438/71 |
| 2005/0056312 A1 | * | 3/2005 | Young et al. | 136/258 |
| 2005/0109392 A1 | * | 5/2005 | Hollars | 136/265 |
| 2007/0193624 A1 | | 8/2007 | Krasnov | |

FOREIGN PATENT DOCUMENTS

WO    2007034110 A1    3/2007

OTHER PUBLICATIONS

International Search Report for PCT/EP2008/067936 dated Oct. 6, 2009.

* cited by examiner

*Primary Examiner* — Jeffrey T Barton
*Assistant Examiner* — Uyen Tran
(74) *Attorney, Agent, or Firm* — Pearne & Gordon LLP

(57) ABSTRACT

The present invention provides an improved thin film solar cell, wherein at least one additional resistive transparent conductive oxide (TCO) layer is incorporated into the solar cell. The additional resistive TCO electrically separates the conductive TCO layers acting as electrodes of such a cell and thus decreases or prevents performance losses. Furthermore, methods for the production of such solar cells are disclosed.

17 Claims, 3 Drawing Sheets

METHOD FOR OBTAINING HIGH PERFORMANCE THIN FILM DEVICES DEPOSITED ON HIGHLY TEXTURED SUBSTRATES

FIELD OF THE INVENTION

The present invention relates to the field of thin film solar cells. Particularly, the present invention discloses a method for the production of an improved thin film solar cell, wherein at least one additional resistive transparent conductive oxide (TCO) layer is incorporated into the solar cell, in order to improve the efficiency of the device. Furthermore, solar cells produced by such a method are disclosed.

BACKGROUND OF THE INVENTION

Usually thin film solar cells are deposited on substrates exhibiting a TCO layer, acting as the electrode of a photovoltaic (PV) cell. Such TCOs are textured to result in a diffuse scattering of light into the thin film absorber layer. The absorber layer is responsible for the conversion of light into electric energy and the diffuse light scattering into the absorber layer, brought about by the textured TCO, enhances the optical path length leading to a higher absorption and thus an improved light trapping that consequently results in an increased efficiency of the PV cell.

An improved light trapping allows for the reduction of the layer thickness of the active absorber layer, keeping the photocurrent in the cells still high. In turn, a reduced absorber layer thickness effects directly the deposition time and, moreover, reduces the light-induced degradation of amorphous Si solar cells. Therefore, as the light scattering ability correlates with the surface texture and roughness of the substrate, an increased surface texture of the TCO is highly desirable.

"Textured TCO" in the context of this application is understood as TCO exhibiting a surface to ambience or interface to an adjacent material resulting in a scattering of light and a haze of the medium-to weakly absorbed light in the photoactive layer of at least 10%. The texturing may result as (a) as-grown, natural effect of a chosen deposition process, (b) from specially designed process environment and -parameters resulting in an increased texturing compared to (a), (c) a post-treatment of a deposition according to (a) and/or (b).

However, conventional deposition processes often lead to an imperfect coverage of the textured TCO substrate by the absorber layer. Particularly, it is known that conformal coverage of layers deposited by the plasma enhanced chemical vapor deposition (PECVD) technique are low and that the layers of the absorber layer deposited by PECVD cover first the highest peaks of the textured TCO and are not well deposited in the depth of the valleys of the highly textured TCO layers, resulting in local photoactive layer thickness variations. Consequently, the subsequent TCO contact deposition results in an electrical contact between the uncovered TCO zones, as depicted in FIG. 1. This direct electrical contact creates undesired current drains within the device leading to device performance losses.

Furthermore, other sources of shunts, such as particles or imperfect laser scribing may likewise result in such direct electrical contacts and thus a poor module performance.

SUMMARY OF THE INVENTION

It is an object of the present invention to provide a thin film solar cell wherein no direct electrical contact between the TCO zones is present and wherein preferably also other sources of shunts are eliminated.

This object is achieved by thin film solar cell comprising a substrate with a textured TCO layer, an absorber layer and a second TCO layer, wherein a resistive TCO layer is deposited between the textured TCO layer and the absorber layer and/or a resistive TCO layer is deposited between the absorber layer and the second TCO layer.

Accordingly, it is an essential idea of the invention to introduce at least one further resistive TCO layer into the thin film solar cell, which leads to the separation of the two conductive TCOs acting as electrodes of the solar cell by at least one layer of resistive material. By these means current drains are decreased or eliminated, resulting in a solar cell with an improved level of efficiency.

All solar cells require a light absorbing material contained within the cell structure to absorb photons and generate electrons via the photovoltaic effect. Thin film solar cells are being developed as a means of substantially reducing the amount of light absorbing material required in creating a solar cell. Thin film solar cells can be produced using less than about 1% of the expensive raw material (for example Si or other light absorbing semiconductors) compared to wafer based cells, leading to a significant price drop per Watt peak capacity. In thin film solar cells, the deposited light absorbing materials are usually strong light absorbers and only need to be about 1 µm thick.

Thin films layers can be deposited by various deposition techniques known to the skilled person. As an example, physical vapor deposition techniques (such as sputtering) or chemical vapor deposition techniques (such as plasma enhanced chemical vapor deposition; PECVD, or low pressure chemical vapor deposition; LPCVD) are mentioned. In specific embodiments of the invention the light absorbing material of the thin film solar cell is selected from the group consisting of amorphous silicon (a-Si), microcrystalline silicon (µc-Si), nanocrystalline silicon (nc-Si), polycrystalline materials, cadmium telluride (CdTe), copper indium (gallium) diselenide (CIS or CIGS), and/or GaAs. CdTe is easier to deposit and more suitable for large-scale production, while CIS/CIGS semiconductors are especially attractive for thin film solar cell application because of their high optical absorption coefficients and versatile optical and electrical characteristics.

Particularly, the use of gallium increases the optical bandgap of the CIGS layer as compared to pure CIS. Therefore, the open-circuit voltage is increased. GaAs based multijunction devices are the most efficient solar cells to date. Preferably, the thin film solar cell comprises amorphous silicon (a-Si), microcrystalline silicon (µc-Si), nanocrystalline silicon (nc-Si) or combinations thereof. In further specific embodiments the silicon is hydrogenated silicon (Si:H), for example a-Si:H, µc-Si:H or nc-Si:H. Silicon can be delivered on a large scale and, unlike elemental Cd, is not toxic.

After absorption of incident light by the absorber layer the generated charges need to be led away from the absorber layer. Therefore, transparent conductive oxide layers (TCO) located on both sides of the absorber layer are employed. These TCOs thus act as electrodes of the photovoltaic cell. Furthermore, the TCO facing the front of the solar cell, i.e. the side through which light enters the solar cell, is textured. Therefore, all subsequent layers/interfaces of layers in such a solar cell are likewise textured.

If light strikes through a textured/rough surface, scattering occurs. The diffuse scattering of transmitted and reflected light in the solar cell results a prolonged effective light path in the absorber layer, leading to a significant increase in the quantum efficiency of the solar cell. Ideally, the incident light is scattered, repeatedly reflected within the solar cell and absorbed by the absorber layer after multiple passes through the i-layer generating the photocurrent. Light scattering on rough surfaces depends on the wavelength of the light, the roughness of the interface, the morphology, the refractive indices of the opposing media and the light incident angle.

An exemplary thin film solar cell according to the invention comprises a substrate onto which a textured TCO layer has been deposited. This textured TCO is followed by an absorber layer that, for example, comprises at least one stack of a pin semiconductor (positively doped, intrinsic, negatively doped semiconductor). The absorber layer is responsible for the conversion of light into electric energy. The absorber layer is followed by a second TCO that, as the textured TCO, serves as an electrode of the solar cell. Additionally, at least one resistive thin layer is present, to separate the two TCOs acting as electrodes.

In specific embodiments of the invention the substrate is a translucent substrate that can be subjected to vapor deposition techniques. Preferably, the substrate is selected from the group consisting of glass, security glass, quartz glass, float glass, a flexible translucent material and/or plastic. In another embodiment of the invention the substrate comprises an anti-reflexion coating so that the amount of incident light reaching the absorber layer is increased.

The absorber layer of the solar cell according to the present invention can have any design that is utilized for thin film solar cells known to the skilled person. Basically, three designs of the absorber layer in thin film cells are currently known: heterojunction devices, pin and nip devices, and multijunction devices.

The heterojunction device is often chosen to produce cells which are made of thin film materials that absorbed light much better than silicon. In heterojunction devices the junction is formed by contacting two different semiconductors, e.g. CdS and CuInSe$_2$. The top layer, or "window" layer, of a heterojunction device is a material with a high band gap selected for its transparency to light. Thus, almost all incident light is allowed to reach the bottom layer, which is produced of a material with low band gap that readily absorbs light. This light then generates electrons and holes very near the junction, thus effectively separating the electrons and holes before they can recombine. An example for a heterojunction device is a CIS or a CIGS cell.

Pin (positively doped, intrinsic, negatively doped semiconductor) and nip (negatively doped, intrinsic, positively doped semiconductor) devices are built-up as a three-layer sandwich with a middle intrinsic (i-type or undoped) layer between an n-type layer and a p-type layer. Due to this geometry, an electric field is generated between the p- and n-type regions that stretches across the middle intrinsic resistive region. Incident light generates free electrons and holes in the intrinsic region, which are then separated by the electric field. An example for a pin device is a pin amorphous silicon (a-Si) cell, comprising a p-type a-Si:H layer, a middle layer of intrinsic Si:H, and an n-type a-Si:H layer. An example for a nip device is a CdTe cell, whose structure is similar to the a-Si cell, except the order of layers is flipped upside down. In a typical CdTe cell, the top layer is p-type cadmium sulfide (CdS), the middle layer is intrinsic CdTe, and the bottom layer is n-type zinc telluride (ZnTe).

Multijunction cells consist of multiple thin films usually produced using molecular beam epitaxy and/or metalorganic vapour phase epitaxy. In a typical multi junction device, individual cells with different band gaps are stacked on top of one another, wherein the individual cells are stacked in such a way that the light falls first on the material having the largest band gap. Photons not absorbed by the first cell are transmitted to the second cell which then absorbs the higher-energy portion of the remaining radiation, while remaining transparent to the lower-energy photons. These selective absorption processes continue through to the final cell, which has the smallest band gap. Multi junction devices are also known as tandem cells.

In specific embodiments of the invention, the absorber layer of the solar cell is that of a heterojunction device, a pin device, a nip device or a multijunction device. In a further embodiment of the invention, the absorber layer of the solar cell comprises at least one stack of a nip or a pin semiconductor. Preferably, the absorber layer of the solar cell comprises at least one stack of a pin semiconductor that comprises doped and undoped silicon. More preferably, the absorber layer consists of a material selected from the group consisting of: amorphous silicon (a-Si), microcrystalline silicon (µc-Si), nanocrystalline silicon (nc-Si), combinations of a-Si, µc-Si and nc-Si, CdTe, and CuIn(Ga)Se$_2$. In a preferred embodiment of the invention the absorber layer comprises sic-Si that shows no or almost no light-induced degradation and also allows capturing light of longer wavelength which leads to an enhanced efficiency of the solar cell. In further specific embodiments the silicon is hydrogenated silicon (Si:H), for example a-Si:H, µc-Si:H or nc-Si:H. The silicon can further comprise carbon, e.g. SiC:H.

In a further embodiment of the invention the p-layer is silicon doped with, e.g. boron or aluminum. The p-layer can have a thickness of ≥5 nm and ≤60 nm, preferably ≥10 nm and ≤50 nm, more preferably ≥15 and ≤40 nm.

In another embodiment of the invention the i-layer is intrinsic, i.e. undoped, Si and has a thickness of ≥50 nm and ≤600 nm, preferably ≥100 nm and ≤500 nm, more preferably ≥250 and ≤350 nm.

In a further embodiment of the invention the n-layer is silicon doped with, e.g. phosphorous. The n-layer can have a thickness of ≥5 nm and ≤50 nm, preferably ≥15 nm and ≤30 nm, more preferably ≥20 and ≤25 nm.

The TCO layers serves as electrical contacts of the absorber layer. In one embodiment of the invention the TCO layer consists of ZnO, SnO$_2$, In$_2$O$_3$/SnO$_3$ (ITO). Preferably, the TCO layers are doped. In one embodiment of the invention the SnO$_2$ TCO is doped with fluoride. In another embodiment of the invention the ZnO TCO layer is doped with boron, or gallium. In a preferred embodiment of the invention the ZnO TCO layer is doped with aluminium (ZnO:Al, or ZnO(:Al)).

In a further embodiment of the invention the textured TCO layer has a root mean square roughness for ZnO of ≥20 nm and ≤1000 nm, preferably ≥30 nm and ≤600 nm, more preferably ≥50 and ≤300 nm. Preferably, the textured TCO layer is a highly textured TCO layer. A highly textured TCO has a roughness of ≥50 nm and a haze of ≥15% and ≤80%, preferably ≥20% and ≤60%. As described above, a higher texturing of the TCO leads to an improved efficiency of the solar cell since light is more efficiently scattered into the absorber layer.

In another embodiment of the invention the textured TCO layer has a transparency of ≥60%, ≥70%, ≥80%, preferably ≥85% and more preferably ≥90%.

The textured TCO and/or second TCO layer has a lower resistivity than the resistive TCO. In one embodiment of the invention the resistivity of the textured TCO and/or second TCO layer is ≤$10^{-2}$ Ωcm, preferably ≤$10^{-3}$ Ωcm, most preferably ≤$5 \times 10^{-3}$ Ωcm.

In another embodiment of the invention the second TCO layer located opposite to the front TCO further comprises a reflective surface. This has the advantageous effect that light not absorbed by the absorber layer is reflected back into the absorber layer and thus the efficiency of the solar cell is increased.

In a conventional thin film solar cell, the direct electrical contact of the two uncovered TCO zones leads to a low resistance path and current drains within the solar cell. The present invention is faced on the unexpected finding that a resistive TCO layer that is deposited between the textured TCO layer and the absorber layer and/or the absorber layer and the second TCO layer leads to a significantly improved solar cell with an increased level of efficiency.

In one embodiment of the invention the additional resistive TCO layer is deposited between the textured TCO layer and the absorber layer. This has the advantageous technical effect that the low resistance path connecting the two conductive TCO layers acting as electrodes of the solar cell is blocked by a thin layer of resistive material. Thus, current drains of the solar cell will be decreased and the level of efficiency of the solar cell will be increased.

In an even more preferred embodiment the additional resistive TCO layer is deposited between the absorber layer and the second conductive TCO layer. This embodiment has the further advantage that the two conductive TCO layers are separated by a high resistance path of a larger dimension which thus more efficiently eliminates undesired current drains and performance losses.

In another even more preferred embodiment of the invention a first resistive TCO layer is deposited between the textured TCO layer and the absorber layer and a second resistive TCO layer is deposited between the absorber layer and the second conductive TCO layer. This embodiment has the advantage of an even better separation of the two TCO layers, in turn leading to an even more improved and more efficient solar cell.

Preferably, the resistive TCO layer(s) are deposited by means of a low, pressure chemical vapor deposition (LPCVD) process or PVD or else. More preferably, ZnO is deposited with the LPCDV process. LPCVD possesses a high potential for conformal deposition over small structures and even for underdeposition. Unexpectedly, it has been found that particularly the deposition of ZnO by means of LPCVD allows for an extremely conformal deposition. The deposition by LPCVD, preferably of ZnO, thus can be utilized to fill up even very deep valleys which result from highly textured TCO layers.

The resistive TCO layer needs to exhibit a resistance that is larger than the resistance of the two conductive TCO layers. In specific embodiments of the invention the resistivity of the resistive TCO layer is $\geq 10^{-2}$ Ωcm and $\leq 10^6$ Ωcm, preferably $\geq 10^2$ Ωcm and $\leq 10^6$ Ωcm, more preferably $\geq 10^4$ Ωcm and $\leq 10^6$ Ωcm, most preferably about $10^5$ Ωcm.

In further specific embodiments of the invention the resistive TCO layer has a thickness of $\geq 20$ nm and $\leq 2000$ nm, preferably $\geq 100$ nm and $\leq 1000$ nm, most preferably $\geq 200$ nm and $\leq 500$ nm.

In another embodiment one or both of the thin resistive TCO layers comprises ZnO or $SnO_2$. Preferably, the ZnO or $SnO_2$ is undoped.

Another aspect of the invention is directed to an array of at least two of the thin film solar cells according to the invention. The solar cells can be connected in a series connection or in a parallel connection, or combinations thereof. Preferably, the solar cells are connected in series.

Another aspect of the present invention is directed to a method for the production of a thin film solar cell comprising the step of depositing at least one resistive TCO layer, wherein the deposited resistive TCO layer is located between the textured TCO layer and the second TCO layer of the thin film solar cell. Thus, at least one resistive (e.g. undoped) TCO layer is deposited to electrically separate the two conductible (e.g. doped) TCO layers that act as the electrodes of the thin film solar cell according to the invention.

In one embodiment the method comprises the steps of: a) providing a substrate with a textured TCO layer; b) depositing an absorber layer; and c) depositing a second TCO layer, wherein at least one further resistive TCO layer is deposited so that the resistive TCO layer is located between the textured TCO layer and the second TCO layer of the thin film solar cell.

Techniques for the deposition of the layers of a thin film solar cell are known to the skilled person. Examples for such deposition techniques are disclosed, inter alia, in U.S. Pat. No. 6,309,906 which is incorporated by reference in its entirety. In one embodiment, the deposition of the layers of the thin film cell is carried out by CVD or PVD techniques, preferably by sputtering, LPCVD, PECVD remote plasma CVD, or "hot wire" techniques. In a further specific embodiment, the absorber layer is deposited by PECVD.

Preferably, the resistive TCO layer(s) are deposited by means of a chemical vapor deposition (CVD) process, more preferably by a low pressure chemical vapor deposition (LPCVD) process. More preferably, ZnO is deposited in this process. LPCVD possesses a high potential for conformal deposition over small structures and even for underdeposition. Unexpectedly, it has been found that especially the deposition of ZnO by means of LPCVD allows for an extremely conformal deposition. The deposition by LPCVD, preferably of ZnO, thus can be utilized to fill up even very deep valleys which result from highly textured TCO layers.

The deposition of the resistive TCO layers by a CVD process, preferably a LPCVD process, has the further advantage that it can easily be obtained by suppressing the doping gas in the process just before the usual deposition of the doped TCO material forming the electrode of the solar cell. Thus, a resistive TCO layer and a consecutive conductive TCO layer (acting as back electrode of the solar cell) can be obtained within a single process and utilizing a single apparatus. The present invention therefore, discloses a simple and time-saving process for the production of thin film solar cells.

In a further specific embodiment the deposition is carried out in a deposition chamber, preferably a vacuum deposition chamber, more preferably in an ultra high vacuum deposition chamber.

In further specific embodiments, the working temperature of the LPCVD process is $\geq 100°$ C. and $\leq 1000°$ C., preferably $\geq 100°$ C. and $\leq 500°$ C., more preferably $\geq 130°$ C. and $\leq 300°$ C.

In another embodiment, the deposition chamber is equipped with a hot plate, onto which the substrate is placed. For the deposition of the resistive TCO layer(s), the temperature of the hotplate is $\geq 100°$ C. and $\leq 500°$ C., preferably $\geq 150°$ C. and $\leq 250°$ C., more preferably about $185°$ C. For the deposition of the conductive, e.g. doped, TCO layer, the temperature of the hotplate is $\geq 100°$ C. and $\leq 500°$ C., preferably $\geq 150°$ C. and $\leq 250°$ C., more preferably $\geq 170°$ C. and $\leq 200°$ C., most preferably about $185°$ C.

In a further specific embodiment, the working pressure during the LPCVD process is $\geq 0.01$ mbar and $\leq 20$ mbar, $\geq 0.01$ mbar and $\leq 2$ mbar, preferably $\geq 0.1$ mbar and $\leq 1$ mbar, more preferably $\geq 0.3$ mbar and $\leq 0.5$ mbar, most preferably about 0.5 mbar.

In another embodiment of the invention, a resistive TCO layer is deposited by means of an LPCVD process in the presence of diethylzinc, $H_2O$ and $H_2$. Preferably, the flowrate of diethylzinc is ≥50 sscm and ≤500 sscm, preferably ≥150 sscm and ≤300 sscm, most preferably about 220 sccm; the flowrate of $H_2O$ is ≥50 sscm and ≤500 sscm, preferably ≥150 sscm and ≤300 sscm, most preferably about 190 sccm; and the flowrate of $H_2$ is ≥40 sscm and ≤400 sscm, preferably ≥100 sscm and ≤250 sscm, most preferably around 150 sccm. The deposition time depends on the targeted layer thickness of the resistive TCO layer and the deposition rate of the system. Typical deposition times for the resistive TCO layer are in the range of 1 to 100 seconds.

In another embodiment of the invention, a conductive TCO layer is deposited by means of a LPCVD process in the presence of diethylzinc, $H_2O$, $H_2$ and $B_2H_6$ (2% in Ar). Preferably, the flowrate of diethylzinc is ≥50 sscm and ≤500 sscm, preferably ≥150 sscm and ≤300 sscm, most preferably about 220 sccm; the flowrate of $H_2O$ is ≥50 sscm and ≤500 sscm, preferably ≥150 sscm and ≤300 sscm, most preferably about 190 sccm; the flowrate of $H_2$ is ≥40 sscm and ≤400 sscm, preferably ≥100 sscm and ≤250 sscm, most preferably around 150 sccm; and the flowrate of $B_2H_6$ is ≥20 sscm and ≤400 sscm, preferably ≥60 sscm and ≤120 sscm, most preferably around 60 sccm.

In a further embodiment a resistive TCO layer and a conductive TCO layer are deposited in the same deposition run, wherein during a single LPCVD deposition process a resistive TCO layer is deposited while no dopant, e.g. $B_2H_6$, is present in the working gas. Then, in the same deposition process, the dopant is added to the working gas to deposit the conductive TCO layer. In another embodiment of the invention, a deposition of the TCO layer and a conductive TCO layer is carried out in two consecutive CVD steps, preferably LPCVD.

Substrates with a textured TCO layer can be provided by various means known to the skilled person. In one embodiment, a TCO layer is deposited on the substrate by means of sputtering, by a LPCVD or a PECVD process, followed by an etching process, e.g. in 0.5% HCl, and/or by means of a laser in order to generate a textured surface. In a further preferred embodiment, the textured surface is generated during LPCVD-ZnO deposition. In another embodiment of the invention, the step of providing a substrate with a textured TCO layer comprises the deposition of a conductive TCO layer on a substrate by means of PVD, LPCVD or PECVD and optionally introducing a texture into said layer by means of etching and/or a laser.

Absorber layers can be deposited by various processes known to the skilled person. In one embodiment of the invention, a silicon-based absorber layer with pin structure is deposited by means of a PECVD process, wherein at least one hydrogenated layer comprising a microcrystalline or nanocrystalline hydrogenated silicon is deposited. Said layer comprises a first positively-doped hydrogenated silicon sublayer, followed by an undoped hydrogenated silicon sublayer, followed by a negatively-doped hydrogenated silicon sublayer. Preferably, silane ($SiH_4$), and $H_2$ gas is used during the deposition process.

In one embodiment of the invention a single resistive TCO layer is deposited before or after the deposition of the absorber layer. Thus, the resulting solar cell comprises one resistive TCO layer that is located between the conductive textured TCO layer and the absorber layer or between the absorber layer and the second conductive TCO layer. Preferably, the single resistive TCO layer is deposited after the deposition of the absorber layer as this leads to a better separation of the two conductive TCOs not covered by the absorber layer by a high resistance path of a larger dimension. As an additional advantage of this preferred embodiment, a resistive TCO layer and a consecutive conductive TCO layer deposited on top of the resistive layer and acting as back electrode of the solar cell can be obtained within a single process and utilizing a single apparatus.

In a more preferred embodiment, a first resistive TCO layers is deposited before the deposition of the absorber layer and a second resistive TCO layer is deposited after the deposition of the absorber layer. This, advantageously, leads to an even better separation of the two conductive TCOs not covered by the absorber layer. As an additional advantage of this preferred embodiment, a resistive TCO layer and a consecutive conductive TCO layer deposited on top of the resistive layer and acting as back electrode of the solar cell can be obtained within a single process and utilizing a single apparatus.

In a further aspect, the invention is directed to a solar cell produced by or obtainable by the methods of the invention.

BRIEF DESCRIPTION OF THE DRAWINGS

These and other aspects of the invention will be apparent from and elucidated with reference to the embodiments described hereinafter.

In the drawings.

DETAILED DESCRIPTION OF EMBODIMENTS

Figure 1:
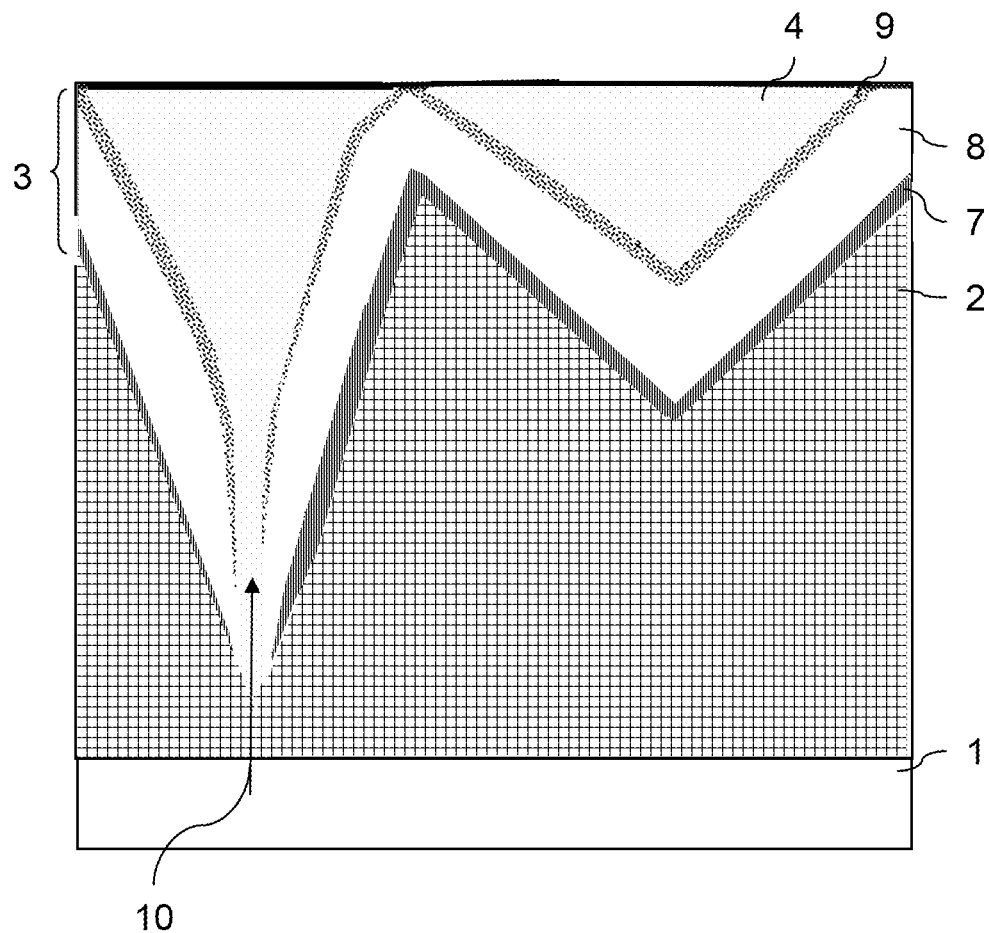
FIG. 1 shows a cross-section through a conventional basic thin film solar cell with pin-structured absorber layer.

FIG. 1 shows a cross-section through a conventional basic thin film solar cell with pin-structured absorber layer. A textured conductive TCO layer 2 is deposited on a substrate 1. On top of this TCO layer an absorber layer 3 is deposited that consists of a p-layer 7, i.e. a layer of a positively doped semiconductor, followed by an i-layer 8, i.e. a layer of an intrinsic semiconductor, followed by an n-layer 9, i.e. a layer of a negatively doped semiconductor. A second conductive TCO layer 4 is deposited on top of the absorber layer. Light is entering the solar cell through the substrate 1, enters the textured TCO layer 2 and is scattered into the absorber layer 3 where the conversion of light into electric energy takes place. The TCO layers (2, 4) serve as electrical contacts of the solar cell. As the absorber layer is not well deposited in the valleys of the textured TCO layer the TCO layers 2 and 4 form a direct electrical contact which leads to a low resistance path 10 and in turn current drains within the device resulting in performance losses.

Figure 2:
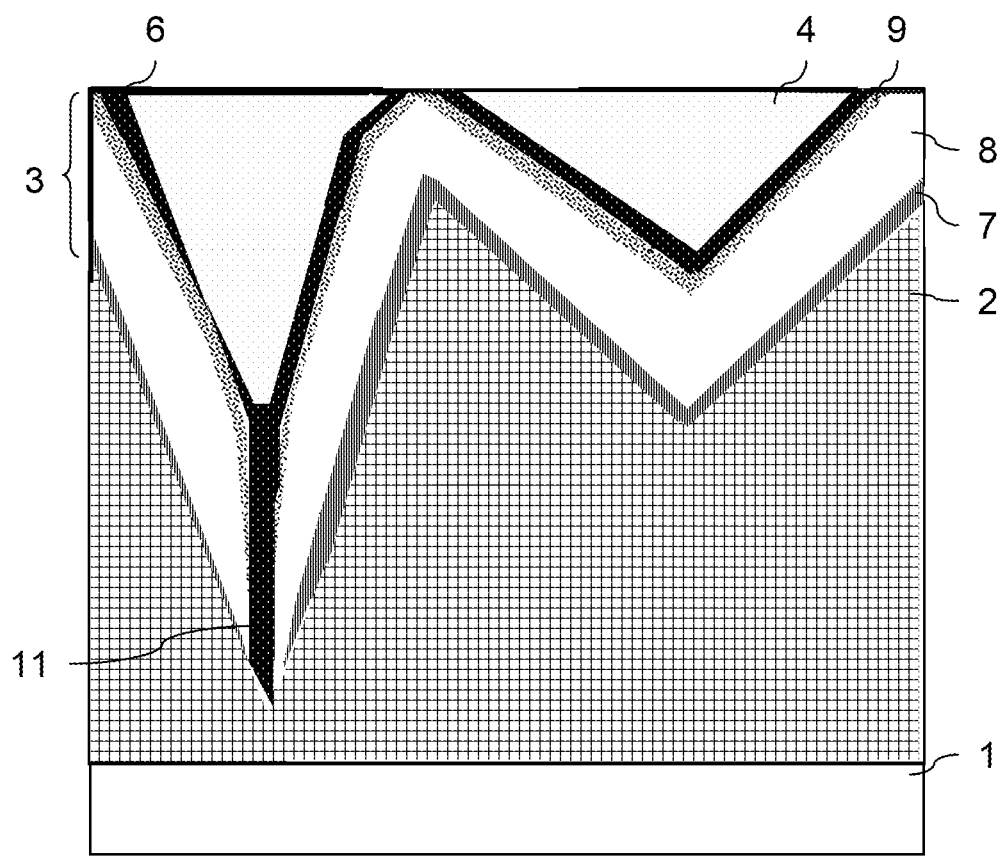
FIG. 2 shows a cross-section of a thin film solar cell according to a preferred embodiment of the invention.

FIG. 2 shows a cross-section of a thin film solar cell according to a preferred embodiment of the invention. The thin film solar cell comprises e.g. a glass substrate 1 of about 90×50 cm onto which a conductive textured TCO of boron-doped ZnO 2 has been deposited. After the deposition of the absorber layer (again comprising a pin structure) a resistive TCO layer 6 is deposited. As the material of the resistive TCO layer has a higher resistivity than the material of the two conductive TCO layers 2 and 4, a high resistance path 11 is formed between these two TCO layers.

The conductive textured TCO was deposited on the glass substrate by means of LPCVD and using a deposition chamber set to about 0.5 mbar and equipped with a hot plate heated to about 190° C. Diethylzinc (DEZ) was used as a precursor for the ZnO deposition. Flowrates during the LPCVD process were: DEZ 220 sccm, $H_2O$ 190 sccm, $H_2$ 150 sccm, $B_2H_6$ (2% in Ar) 80 sccm.

Deposition was carried out for 900 seconds, resulting in a layer thickness of about 2000 nm. The roughness of the textured TCO layer 2 is about 60 nm. The resistivity of the textured TCO layer 2 is about $2 \times 10^{-3}$ Ωcm.

On top of the textured conductive ZnO TCO 2 an absorber layer 3 with a pin structure has been deposited. The absorber layer comprises three sublayers of hydrogenated amorphous silicon (a-Si:H). The bottom sublayer 7 directly deposited on top of the textured TCO 2 is positively doped (p-layer), followed by an intermediate layer 8 that is not doped (i-layer), followed by a negatively doped (n-layer) layer 9. The thickness of the p-, i- and n-layers is about 30 nm, 250 nm and 25 nm, respectively.

The deposition of the absorber layer was carried out using a PECVD process, wherein the hydrogenated silicon was deposited from $SiH_4$ in the presence of $H_2$ using RF power for plasma generation.

After the deposition of the absorber layer 3 the resistive TCO layer 6 and the second conductive TCO layer 4 were deposited in a single LPCVD process. The deposition chamber was set to 0.5 mbar and equipped with a hotplate heated to 185° C.

First, the resistive TCO layer 6 was deposited using DEZ, $H_2O$ and $H_2$ with the following flowrates: DEZ 220 sscm; $H_2O$ 190 sccm; $H_2$ 150 sccm. Deposition was carried out for 1 to 100 seconds, yielding a thickness of about 1 to 100 nm. The resistivity of the resistive TCO layer 6 is about $10^5$ Ωcm. The deposition of the resistive TCO layer led to the formation of a high resistance path 11 separating the two conductive TCO layers 2 and 4.

After completion of the deposition of the resistive TCO layer 6 $B_2H_6$ (2% in Ar) was added to the working gas with a flow rate of about 80 sccm to deposit the conductive TCO layer 4 in the same LPCVD process. Deposition was carried out for 600 seconds, yielding a thickness of the TCO layer 4 of about 1600 nm. The resistivity of the conductive TCO layer 4 is about $2 \times 10^{-3}$ Ωcm.

The resulting thin film solar cell had an open circuit voltage ($V_{oc}$) of about 860 mV and a fill factor (FF) of about 72%. Compared to an otherwise identical thin film solar cell without a resistive TCO layer 6 having an open circuit voltage ($V_{oc}$) of about 860 mV and fill factor (FF) of about 69%, the conversion efficiency could be improved by about 4%.

Figure 3:
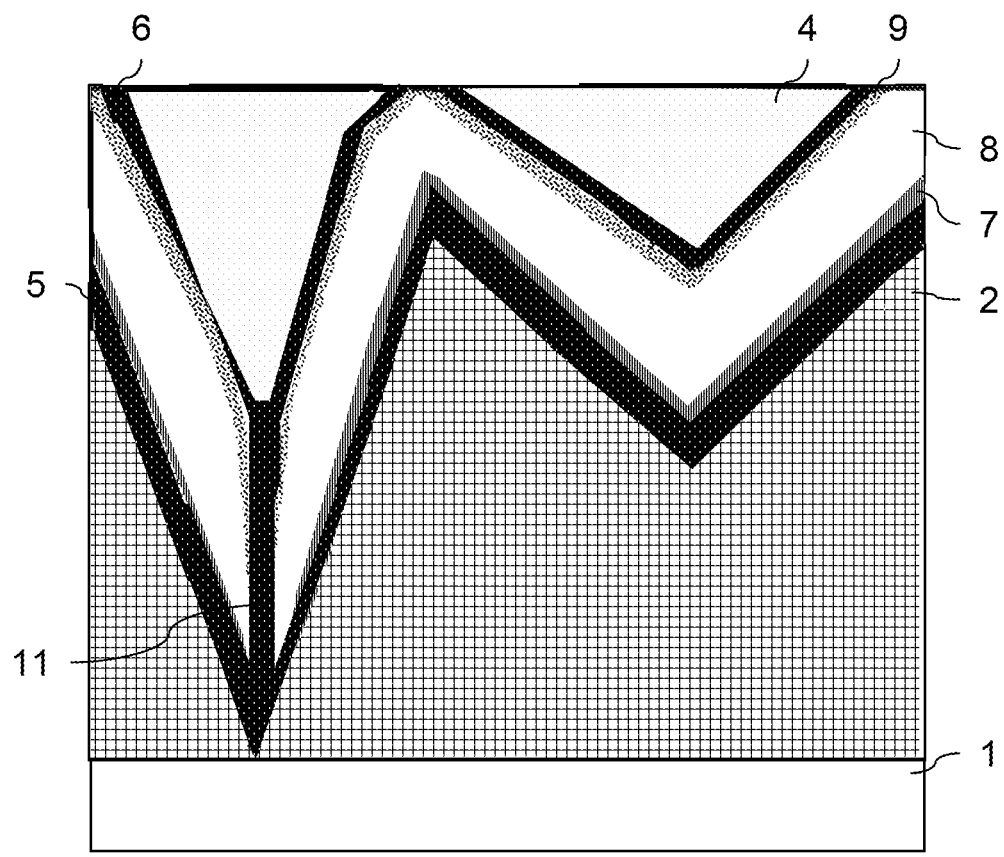
FIG. 3 shows a cross-section through a further embodiment of a thin film solar cell according to the invention.

FIG. 3 shows a cross-section through a further embodiment of a thin film solar cell according to the invention, wherein a resistive TCO layer has been deposited before and after the deposition of the pin absorber layer. Thus, a first resistive layer 5 is present between the textured conductive TCO layer 2 and the absorber layer 3 and a second resistive TCO layer 6 is present between the absorber layer 3 and the second conductive TCO layer 4. Accordingly, two resistive TCO layers 5, 6 have been introduced. The deposition of the conductive and resistive TCO layers, as well as the absorber layer was carried out using the parameters and processes described above.

Particularly, the thin film solar cell comprises a glass substrate 1 onto which a conductive textured TCO of boron-doped ZnO 2 has been deposited by means of LPCVD. Again, DEZ was used as a precursor for the ZnO deposition. The dopant used was $B_2H_6$ (2% in Ar). The conductive textured TCO layer 2 has a thickness of about 1700 nm. The roughness is about 60 nm and the resistivity of the textured TCO layer 2 is about $2 \times 10^{-3}$ Ωcm.

After completion of the deposition of the conductive textured TCO layer 2, a further LPCVD process was carried out in order to deposit a resistive TCO layer 5. The resistive TCO layer 5 was deposited using DEZ, $H_2O$ and $H_2$ with the following flowrates: DEZ 220 sscm; $H_2O$ 190 sccm; $H_2$ 150 sccm. Deposition was carried out for 20 seconds, yielding a thickness of about 100 nm. The resistivity of the resistive TCO layer 5 is about $10^5$ Ωcm. On top of the resistive ZnO TCO 5 an absorber layer 3 with a pin structure was deposited as described above.

Finally, a resistive TCO layer 6 and the second conductive TCO layer 4 were deposited in a single LPCVD process as described above. Again, the resistive TCO layer 6 was deposited using DEZ, $H_2O$ and $H_2$, while for the deposition of the conductive TCO layer 4 $B_2H_6$ (2% in Ar) was added to the working gas. The thickness of the resistive TCO layer 6 is about 100 nm, the resistivity of the resistive TCO layer 6 is about $10^5$ Ωcm. The thickness of the conductive TCO layer 4 is about 1600 nm, the resistivity is about $2 \times 10^{-3}$ Ωcm.

As can be taken from FIG. 3 the deposition of the two resistive TCO layers 5, 6 led to the formation of a high resistance path 11 separating the two conductive TCO layers 2 and 4.

While the invention has been illustrated and described in detail in the drawings and foregoing description, such illustration and description are to be considered illustrative or exemplary and not restrictive; the invention is not limited to the disclosed embodiments. Other variations to be disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting scope.

What is claimed is:

1. A thin film solar cell, comprising:
   a translucent substrate;
   a textured TCO layer on the substrate;
   an absorber layer on the textured TCO layer, the absorber layer having a pin structure;
   a resistive TCO layer on the absorber layer; and
   a second TCO layer on the resistive TCO layer,
   wherein the absorber layer extends between the second TCO layer and the textured TCO layer,
   wherein the resistive TCO layer is provided between the absorber layer and the second TCO layer such that a high resistance path is formed within the absorber layer, and
   wherein a material of the resistive TCO layer has a resistivity that is greater than a resistivity of a material of the textured TCO layer and a resistivity of a material of the second TCO layer.

2. The solar cell according to claim 1, further comprising:
   a second resistive TCO layer disposed between the textured TCO layer and the absorber layer.

3. The solar cell according to claim 1, wherein a texture of the textured TCO layer has a roughness of ≥30 nm and ≤600 nm.

4. The solar cell according to claim 1, wherein the absorber layer comprises at least one pin structure comprising amorphous hydrogenated silicon.

5. The solar cell according to claim 1, wherein a resistivity of the resistive TCO layer is greater than a resistivity of the textured TCO layer and a resistivity of the second TCO layer.

6. The solar cell according to claim 2, wherein a resistivity of the second resistive TCO layer is greater than a resistivity of the textured TCO layer and a resistivity of the second TCO layer.

7. The solar cell according to claim 1, wherein the resistive TCO layer comprises undoped ZnO.

8. The solar cell according to claim 2, wherein the second resistive TCO layer comprises undoped ZnO.

9. An array of at least two solar cells according to any of claims 1 to 8.

10. A method for the production of a thin film solar cell comprising the step of depositing at least one resistive TCO layer, wherein the deposited resistive TCO layer is located between a textured TCO layer and a second TCO layer of the thin film solar cell wherein the thin film solar cell comprises:
   a translucent substrate;
   the textured TCO layer on the substrate;
   an absorber layer on the textured TCO layer, the absorber layer having a pin structure;
   the resistive TCO layer on the absorber layer; and
   the second TCO layer on the resistive TCO layer,
   wherein the absorber layer extends between the second TCO layer and the textured TCO layer,
   wherein the resistive TCO layer is provided between the absorber layer and the second TCO layer such that a high resistance path is formed within the absorber layer, and
   wherein a material of the resistive TCO layer has a resistivity that is greater than a resistivity of a material of the textured TCO layer and a resistivity of a material of the second TCO layer.

11. The method according to claim 10 comprising the steps of:
   a) providing a substrate with the textured TCO layer;
   b) depositing an absorber layer; and
   c) depositing the second TCO layer, wherein
   at least one further resistive TCO layer is deposited so that the resistive TCO layer is located between the textured TCO layer and the second TCO layer of the thin film solar cell.

12. The method according to claim 11, wherein deposition of the TCO layers is carried out by LPCVD.

13. The method according to claim 12, wherein the deposition of the resistive TCO layer is carried out in a single LPCVD process together with the deposition of the second TCO layer.

14. The method according to claim 11, wherein a first resistive TCO layer is deposited before step b) and a second resistive TCO layer is deposited after step b).

15. The solar cell according to claim 1, wherein the textured TCO layer contacts the substrate.

16. The solar cell according to claim 1, wherein the absorber layer extends between the textured TCO layer and the resistive TCO layer.

17. The solar cell according to claim 1, wherein the absorber layer is in direct contact with the textured TCO layer and the resistive TCO layer.

* * * * *